United States Patent [19]
Hayafuji et al.

[11] Patent Number: 5,682,045
[45] Date of Patent: Oct. 28, 1997

[54] METHOD OF FABRICATING SEMICONDUCTOR DEVICE AND SEMICONDUCTOR DEVICE FABRICATED THEREBY

[75] Inventors: Norio Hayafuji; Yoshitsugu Yamamoto, both of Itami, Japan

[73] Assignee: Mitsubishi Denki Kabushiki Kaisha, Tokyo, Japan

[21] Appl. No.: 525,175

[22] Filed: Sep. 8, 1995

[30] Foreign Application Priority Data

Sep. 9, 1994 [JP] Japan .................. 6-215843

[51] Int. Cl.⁶ .................. H01L 31/0328; H01L 21/324
[52] U.S. Cl. .................. 257/192; 257/284; 257/12; 257/27; 257/613; 437/82; 437/107; 437/126; 437/133; 437/247; 437/912
[58] Field of Search .................. 257/192, 284, 257/12, 27, 613; 437/82, 107, 126, 133, 247, 912

[56] References Cited

U.S. PATENT DOCUMENTS

| | | |
|---|---|---|
| 4,246,296 | 1/1981 | Chang . |
| 4,945,065 | 7/1990 | Gregory et al. . |
| 5,047,369 | 9/1991 | Fleming et al. .................. 437/240 |
| 5,258,631 | 11/1993 | Usagawa et al. . |

FOREIGN PATENT DOCUMENTS 1296672  11/1989  Japan .

OTHER PUBLICATIONS

Applied Physics Letters, vol. 59, No. 21, 18 Nov. 1991, pp. 2703–2705, XP000265189, S. J. Pearton, "Dopant Passivation In AlInas And InGap By Atomic Deuterium".

Fujita et al., "Novel HEMT Structures Using A Strained InGap Schottky Layer", Fifth International Conference on Indium Phosphide and Related Materials, Jan. 1993, pp. 497–500.

*Primary Examiner*—Edward Wojciechowicz
*Attorney, Agent, or Firm*—Leydig, Voit & Mayer

[57] ABSTRACT

An Si-doped AlInAs layer and an intrinsic AlInAs layer are successively grown on a semi-insulating InP substrate in a molecular beam epitaxy chamber. The sample is then heat-treated in a nitrogen ambient at 400° C. for 18 minutes so that electrical characteristics of the sample are deteriorated because of the infiltration of fluorine into the Si-doped AlInAs layer. The sample is then placed in the molecular beam epitaxy chamber and reheat-treated in an ultra-high vacuum at 400° C. for seven minutes and the fluorine is removed.

8 Claims, 10 Drawing Sheets

Fig. 3 condition for reheat treatment (environment)

Fig. 7 Prior Art $$\frac{N_s}{N_{so}} = \frac{\text{sheet carrier concentration after heat treatment}}{\text{sheet carrier concentration before heat treatment}}$$

I : heat-treated under N₂
II : heat-treated in ultra-high-vaccum (after I)
III : heat-treated under N₂ (after II)

Fig. 12

● : deterioration of characteristics
○ : recovery of characteristics

METHOD OF FABRICATING SEMICONDUCTOR DEVICE AND SEMICONDUCTOR DEVICE FABRICATED THEREBY

FIELD OF THE INVENTION

The present invention relates to a method of fabricating a semiconductor device for improving reliability of a semiconductor device, and a semiconductor device fabricated thereby.

BACKGROUND OF THE INVENTION

Figure 5:
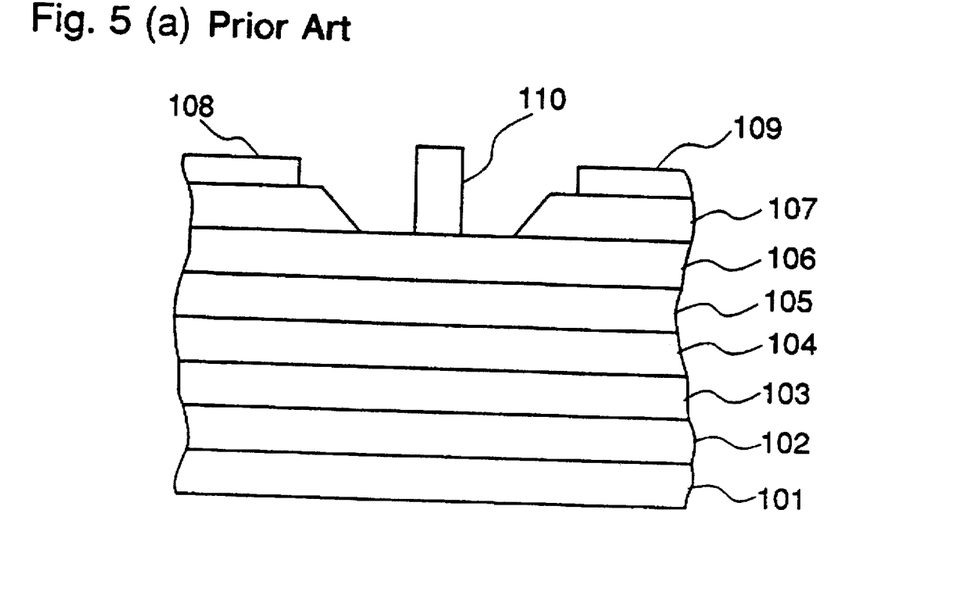
FIG. 5(a) is a cross-sectional view illustrating a structure of an HEMT as an example of a prior art semiconductor device.
FIG. 5(b) is a graph illustrating deterioration of electrical characteristics due to heat treatment of the prior art HEMT.

FIGS. 5(a)–5(b) were shown in Extended Abstract WC2 pp497–500 of Fifth International Conference on Indium Phosphide and Related Materials, held from Apr. 19 to 22, 1993 in Paris, France. FIG. 5(a) is a cross-sectional view illustrating a structure of a prior art HEMT (high electron mobility transistor) which has an n type InAlAs carrier supply layer on an InP substrate and a Schottky barrier formation layer on the n type InAlAs carrier supply layer. FIG. 5(b) is a graph for explaining deterioration of electrical characteristics of the HEMT due to heat.

In FIG. 5(a), reference numeral 101 designates a semi-insulating (abbreviated as S.I.- hereinafter) InP substrate, reference numeral 102 designates an undoped InP layer about 10 nm thick, reference numeral 103 designates an undoped InGaAs channel layer about 20 nm thick, reference numeral 104 designates an undoped InAlAs spacer layer about 3 nm thick, reference numeral 105 designates an n$^+$ type InAlAs electron supply layer about 15 nm thick having a $3\times10^{18}$ cm$^{-3}$ dopant impurity concentration, reference numeral 106 designates a Schottky barrier formation layer about 10 nm thick comprising materials such as undoped In$_{0.75}$Ga$_{0.25}$P, reference numeral 107 designates an n$^+$ type InGaAs ohmic layer about 20 nm thick having a $5\times10^{18}$ cm$^{-3}$ dopant impurity concentration, reference numeral 108 designates a source electrode, reference numeral 109 designates a drain electrode, and reference numeral 110 designates a gate electrode.

In FIG. 5(b), the abscissa represents heat treatment temperature (unit: C.) and the ordinate represents sheet carrier concentration (unit: $\times10^{12}$ cm$^{-3}$) of a two-dimensional electron gas formed at the interface of the undoped InGaAs channel layer 103 and to the undoped InAlAs spacer layer 104. In the figure, circles, triangles, and squares represent cases where the Schottky barrier formation layer 106 comprises In$_{0.75}$Ga$_{0.25}$P, InP, and InAlAs, respectively.

Deterioration of electrical characteristics of an HEMT due to heat will be described as follows. In the above reference, Fujita, who is the author of the reference, and others prepared three different semiconductor layer structures whose main part is similar to that of the HEMT illustrated in FIG. 5(a) comprising the undoped InP layer 102, the undoped InGaAs channel layer 103, the undoped InAlAs spacer layer 104, the n$^+$ type InAlAs electron supply layer 105, and the Schottky barrier formation layer 106 comprising any one material from a group consisting of In$_{0.75}$Ga$_{0.25}$P, InP, and InAlAs grown in this order on the semiconductor substrate 101. These semiconductor layer structures were heat-treated for five minutes at temperatures of 300° C. or 350° C. under an environment supplied with nitrogen gas, and sheet carrier concentrations of the two-dimensional electron gas formed at the interface of the undoped InGaAs channel layer 103 and the undoped InAlAs spacer layer 104 were measured. The results are as illustrated in FIG. 5(b). From the figure, regardless of the material for the electrode layer 106, which is any one of a group consisting of the In$_{0.75}$Ga$_{0.25}$P, the InP, and the InAlAs, the sheet carrier concentrations decrease after the heat treatment at a temperature of 300° C. or above.

These results indicate that, if heat treatment at a temperature of 300° C. or above is performed, the electrical characteristics of an HEMT are deteriorated by heat and a desired sheet carrier concentration cannot be obtained. As a result, the resistance of the region where the two-dimensional electron gas is formed increases and the expected HEMT characteristics cannot be obtained. Concerning this phenomenon, Fujita et al commented that this decrease in the surface sheet carrier concentration was due to an increase in a surface depletion layer caused by surface deterioration of the InAlAs layer.

Figure 6:
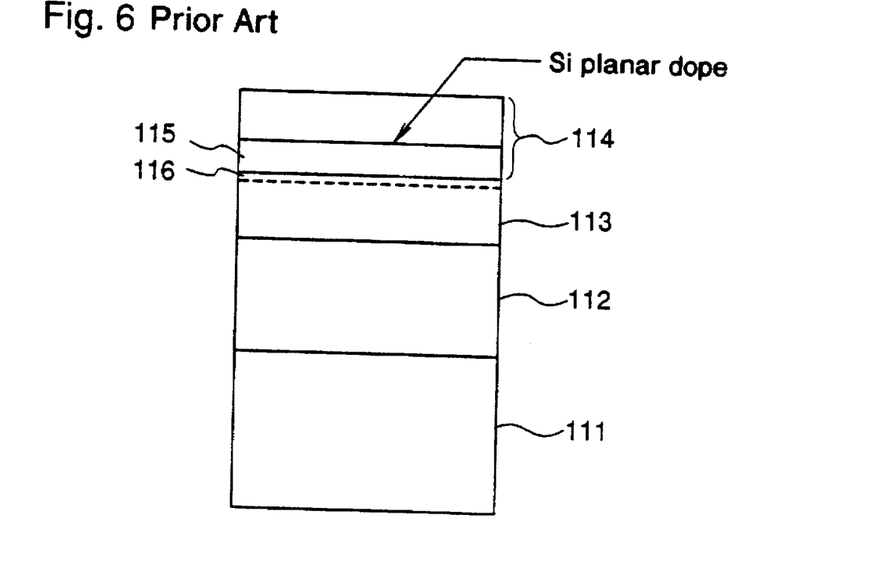
FIG. 6 is a cross-sectional view illustrating a semiconductor layer structure for describing a deterioration of electrical characteristics of a semiconductor which occurs due to a heat treatment in a method of fabricating a prior art semiconductor device.
Figure 7:
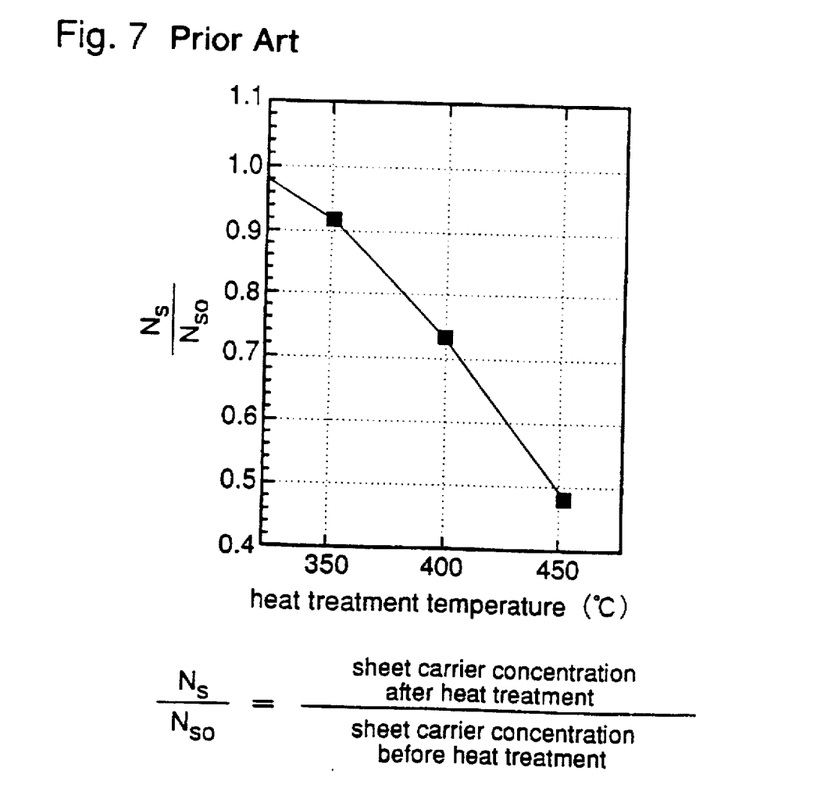
FIG. 7 is a graph illustrating a relationship between a sheet carrier concentration and a heat treatment temperature for describing deterioration of electrical characteristics of a semiconductor device which occurs due to a heat treatment in a method of fabricating a prior art semiconductor device.

The inventors of the present invention have also studied the deterioration of electrical characteristics of an HEMT due to heat. FIG. 6 illustrates a semiconductor layer structure used in the study by the inventors of the present invention and FIG. 7 illustrates the result obtained from this study. In FIG. 6, reference numeral 111 designates an S.I.-InP substrate, reference numeral 112 designates an intrinsic (abbreviated as i- hereinafter) AlInAs buffer layer 5000 Å thick, reference numeral 113 designates an i-InGaAs channel layer 2500 Å thick, and reference numeral 114 designates an AlInAs carrier supply layer of 340 Å thick in which a planar doping with Si is performed at a 20 Å spacing from the channel layer 113. A layer portion of the carrier supply layer 114 from the channel layer 113 to the Si planar doping is designated as a spacer layer 115. Reference numeral 116 designates a two-dimensional electron gas formed in the vicinity of the interface of the i-GaInAs channel layer 113 and the InAlAs electron supply layer 114 side.

In FIG. 7, the abscissa represents heat treatment temperature (unit: C.) and the ordinate represents a ratio of sheet carrier concentration $N_s$ after the heat treatment to that before the heat treatment $N_{s0}$, i.e., $N_s/N_{s0}$.

This study was carried out as follows. The semiconductor layer structure having a similar structure to an HEMT comprising the InAlAs electron supply layer 114 which was planar-doped with Si and was formed on the i-GaInAs channel layer 113 was heat-treated for fifteen minutes at different temperatures under a nitrogen environment. Then the sheet carrier concentration of the two-dimensional electron gas layer 116 formed in the vicinity of the interface of the i-GaInAs channel layer 113 and the electron supply layer 114 was measured by Hall measurement. As illustrated in FIG. 7, even in the semiconductor layer structure such as this, the sheet carrier concentration decreases due to heat treatment and, by including a heat treatment process, an HEMT whose electrical characteristics are deteriorated is formed.

As described above, in a semiconductor device having an InAlAs layer doped with an impurity, such as a prior art HEMT, if heat treatment is performed under an environment including a carrier such as nitrogen or hydrogen gas, the deterioration of electrical characteristics such as the decrease in the sheet carrier concentration occurs. Usually, in order to confirm the reliability of a semiconductor device, a method of confirming changes of the characteristics after a lapse of time is used, in which the semiconductor device is operated under a high temperature environment in which the characteristics of the semiconductor device are likely to be deteriorated. However, in the prior art semiconductor device, when a reliability test including heat treatment such as this is conducted, a decrease in the sheet carrier concentration occurs and satisfactory results cannot be obtained. As a result, a semiconductor device of high reliability cannot be obtained.

Furthermore, since the characteristics are deteriorated by heat as described above, it is extremely difficult to operate the prior art semiconductor device at a high temperature for a long period of time while maintaining desired characteristics. It is also difficult to provide a semiconductor device which has high reliability during high temperature operation.

Furthermore, if a heat treatment process at high temperature is necessary after the formation of an InAlAs layer doped with an impurity in a method of fabricating the prior art semiconductor device, the electrical characteristics of this InAlAs layer doped with an impurity are deteriorated by heat and a semiconductor device with desired characteristics cannot be obtained. For example, in an HEMT having an InAlAs layer doped with an impurity as a carrier supply layer, if the deterioration due to heat like this occurs, the sheet carrier concentration of two-dimensional electron gas decreases and desired operational characteristics cannot be obtained.

SUMMARY OF THE INVENTION

It is an object of the present invention to provide a method of fabricating a highly reliable semiconductor device having desired electrical characteristics.

It is another object of the present invention to provide a highly reliable semiconductor device having desired electrical characteristics.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method of fabricating a semiconductor device comprises forming a layer comprising Al, In, and As and doped with an impurity; infiltrating fluorine into the layer comprising Al, In, and As and doped with an impurity by performing heat treatment to this layer; and removing the fluorine from the layer comprising Al, In, and As and doped with an impurity by performing reheat treatment after the heat treatment. Therefore, in a method of fabricating a semiconductor device, for example, where a process of infiltrating fluorine into the layer comprising Al, In, and As and doped with an impurity by performing heat treatment is not necessary, by actively infiltrating fluorine into the this layer comprising Al, In, and As and doped with an impurity by heat treatment and then removing the fluorine by performing further heat treatment, electrical characteristics of the layer comprising Al, In, and As and doped with an impurity can be made hard to be deteriorated.

Furthermore, in a method of fabricating a semiconductor device including a process of infiltrating fluorine by heat treatment, by performing heat treatment to remove the fluorine after the process of infiltrating the fluorine, the layer comprising Al, In, and As can be recovered from a state of electrically deteriorated characteristics. As a result, the layer comprising Al, In, As and doped with an impurity having desired electrical characteristics can be obtained and re-deterioration of this layer can be prevented.

According to a second aspect of the present invention, in the method of fabricating the semiconductor device described as the first aspect of the present invention, the reheat treatment for removing the fluorine from the layer comprising Al, In, and As and doped with an impurity is performed either in vacuum or under any one environment selected from a group consisting of an environment supplied with nitrogen gas, an environment supplied with hydrogen gas, and an environment supplied with both nitrogen gas and hydrogen gas. Therefore, by removing the fluorine from the layer comprising Al, In, and As and doped with an impurity, this layer can be recovered from a state of electrically deteriorated characteristics caused by heat.

According to a third aspect of the present invention, in the method of fabricating the semiconductor device described as the first aspect of the present invention, the semiconductor device is a high electron mobility transistor; and the layer comprising Al, In, and As and doped with an impurity is a carrier supply layer of the high electron mobility transistor. Therefore, the carrier supply layer whose electrical characteristics are hard to be deteriorated can be obtained.

According to a fourth aspect of the present invention, a method of fabricating a semiconductor device comprises preparing a semi-insulating substrate; forming an undoped channel layer on the semi-insulating substrate; forming a carrier supply layer which comprises a layer comprising Al, In, and As and doped with an impurity on the channel layer; forming an ohmic layer on the carrier supply layer; forming a source electrode and a drain electrode on the ohmic layer; forming an opening by etching a portion of the ohmic layer between the source electrode and the drain electrode so that the carrier supply layer is exposed; infiltrating fluorine into the carrier supply layer by performing heat treatment to this carrier supply layer; removing the fluorine from the carrier supply layer by performing reheat treatment after the heat treatment; and forming a recess on the portion of the carrier supply layer exposed in the opening and, then, forming a gate electrode on the bottom of the recess. Therefore, the carrier supply layer whose electrical characteristics are hard to be deteriorated can be obtained.

According to a fifth aspect of the present invention, a semiconductor device has a layer comprising Al, In, and As and doped with an impurity wherein the layer comprising Al, In, and As and doped with an impurity is heat-treated so that fluorine is infiltrated into this layer and, then, reheat-treated so that the fluorine is removed from this layer. Therefore, a semiconductor device having a layer comprising Al, In, and As and doped with an impurity which has desired electrical characteristics, this electrical characteristics being hard to be deteriorated, can be obtained

DETAILED DESCRIPTION OF THE PREFERRED EMBODIMENTS.

[Embodiment 1]

Figure 8:
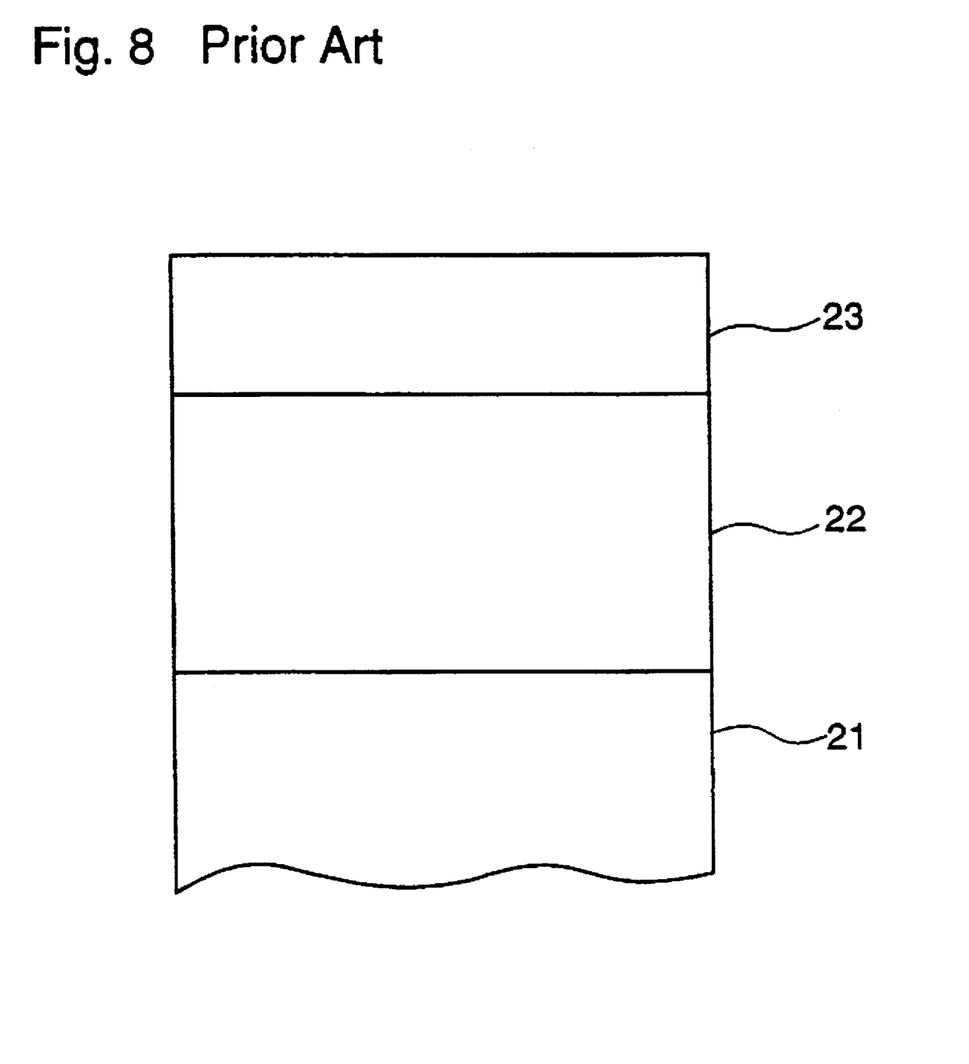
FIG. 8 is a cross-sectional view for describing deterioration of electrical characteristics of a semiconductor device which occurs due to a heat treatment in a method of fabricating a prior art semiconductor device.

FIG. 8 is a cross-sectional view illustrating a semiconductor layer structure used in a study in search for causes of the deterioration of electrical characteristics of the prior art semiconductor device due to heat. In the figure, reference numeral 21 designates an S.I.-InP substrate, reference numeral 22 designates an i-AlInAs layer about 4000 Å thick, reference numeral 23 designates an AlInAs layer doped with Si as an impurity and about 1300 Å thick.

This study was conducted as follows. The semiconductor layer structures as shown in FIG. 8 in which the i-AlInAs layer 22 and the AlInAs layer 23 which was planar-doped with Si were successively formed on the S.I.-InP substrate 21 in an MBE (molecular beam epitaxy) chamber were taken out from the chamber, and then the semiconductor structures were heat-treated for fifteen minutes under a nitrogen environment at 300° C. for one of them, 400° C. for another one of them, and 450° C. for yet another one of them. And then impurity analysis of the semiconductor layer structure was made by SIMS (secondary ion mass spectroscopy). The result of the impurity analysis is illustrated in FIG. 9.

Figure 9:
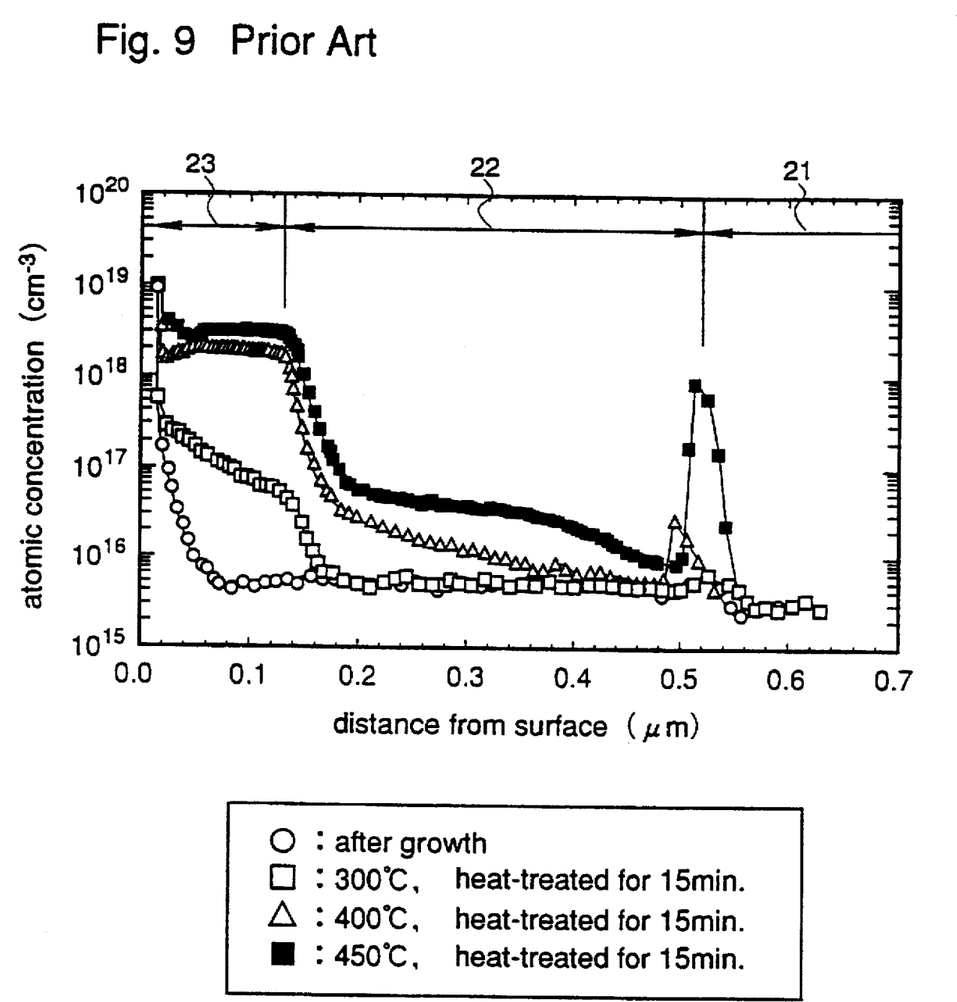
FIG. 9 is a graph illustrating a fluorine profile for describing a deterioration of electrical characteristics of a semiconductor device which occurs due to a heat treatment in a method of fabricating a prior art semiconductor device.

In FIG. 9, the abscissa represents a distance (unit: μm) from the surface of the semiconductor layer structure and the ordinate represents an atomic concentration (unit: $cm^{-3}$) of fluorine. In the figure, white circles represent a fluorine profile (distribution) of the semiconductor layer structure before the heat treatment, and white squares, white triangles, and black squares represent fluorine profiles for heat treatment temperatures of 300° C., 400° C., and 450° C., respectively.

From the study, the following facts are ascertained. First, $^{19}F$ (fluorine) infiltrates the semiconductor layer structure due to the heat treatment. Secondly, the amount of $^{19}F$ increases with the heat treatment temperatures. Thirdly, the infiltration of $^{19}F$ is prominent in the Si-doped layer, and finally, $^{19}F$ accumulates at the interface between the epitaxial layer and the substrate as well. The first fact above is based on the result obtained by detection of mass number 19, checking for the entire mass range for impurities during SIMS measurement.

From the above first, second, third, and fourth facts, a new fact that the fluorine ($^{19}F$) infiltrates the semiconductor layer structure due to heat treatment, which had not previously been known, was ascertained. Since the fluorine was not detected at all from materials except the AlInAs layer 23 which was doped with Si, it was considered that the phenomenon that the fluorine infiltrated the semiconductor layer was characteristic only to the AlInAs layer 23 which was doped with an impurity such as Si. The infiltrating route of the fluorine was investigated, but fluorine was not used in the growth chamber for MBE or MOCVD or the like used for the growth of the semiconductor layer structure, and fluorine was not actively supplied inside the laboratory, either. When the uppermost surface of the Si-doped AlInAs layer 23 right after the growth was analyzed by ESCA (electron spectroscopy for chemical analysis), about 0.3 atomic % of fluorine was detected. From this, it was considered that fluorine resulted from hydrofluoric acid (HF) or the like used in semiconductor fabricating processes remaining in the air inside the laboratory. This minute amount of fluorine, when the uppermost surface of the Si-doped AlInAs layer 23 was exposed to the atmosphere, was attracted to and stuck to the surface, and resulted in the infiltration into the AlInAs layer 23.

Together with this analysis of fluorine, although not shown in the figure, changes of the profile after a lapse of time before and after the heat treatment were investigated for elements besides fluorines, such as nitrogen, and the results were that almost the same profiles were obtained before and after the heat treatment.

As described above, since the fluorine in the atmosphere sticks to and infiltrates the AlInAs layer 23 doped with Si because of the heat treatment and the change in profile due to the heat treatment is not observed for other elements, it is considered that the deterioration of electrical characteristics of a semiconductor device is caused by the phenomenon that the fluorine sticks to and infiltrates the semiconductor layer structure because of the heat treatment.

In order to prevent this deterioration due to the infiltration of the fluorine, one of the choices is to remove the fluorine left in the atmosphere entirely. However, the fluorine in the atmosphere in a plant where semiconductor devices are fabricated cannot usually be removed entirely. A perfect removal would be extremely difficult and it is considered to be difficult to prevent the fluorine infiltration.

Therefore, as long as there is the phenomenon that due to the heat treatment the fluorine infiltrates through the surface of the AlInAs layer doped with an impurity such as Si which makes a contact with the atmosphere, the deterioration of the semiconductor device having the AlInAs layer doped with an impurity because of the heat treatment cannot be avoided.

Figure 10:
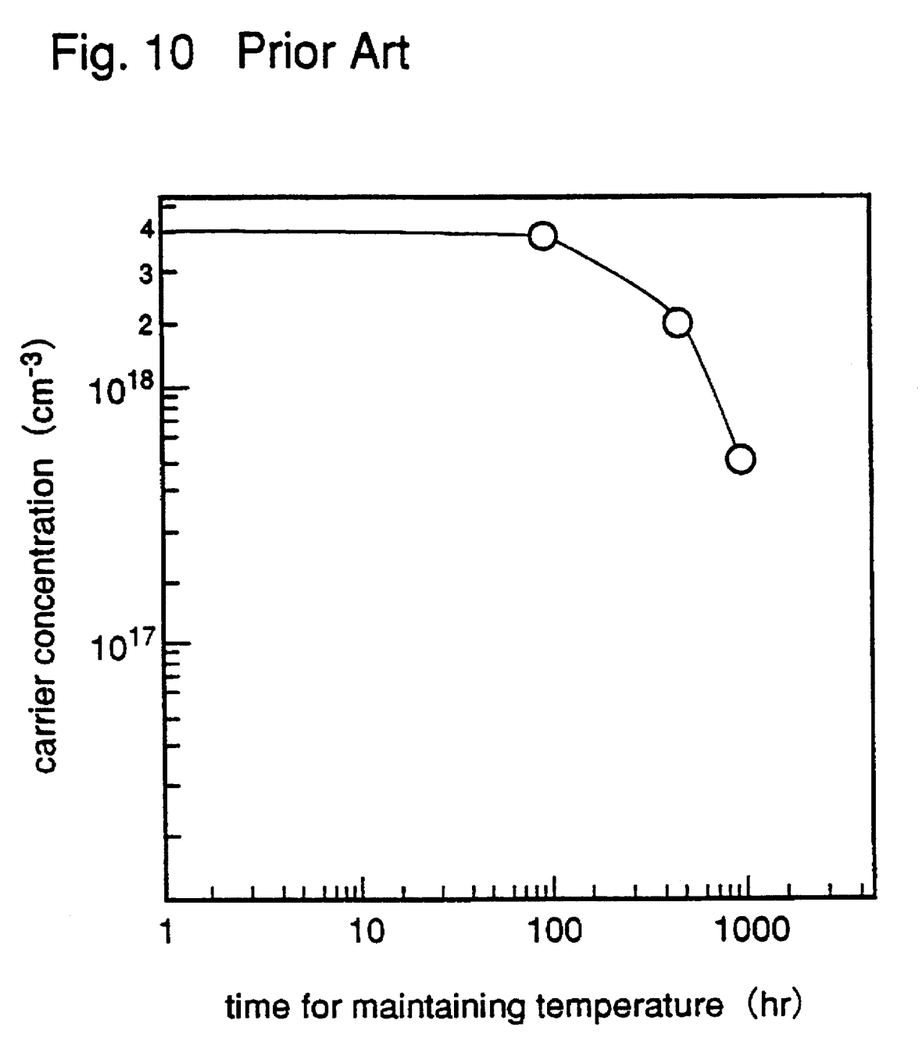
FIG. 10 is a graph illustrating a deterioration of electrical characteristics of a semiconductor device which occurs due to a heat treatment at 200° C. in a method of fabricating a prior art semiconductor device.

Furthermore, even though the heat treatment temperature is below the temperature selected in the above study, it is confirmed that the deterioration due to heat becomes pronounced by maintaining the temperature for a long period of time. FIG. 10 is a graph illustrating a relationship between the carrier concentration of the Si-doped AlInAs layer 23 and the time duration of maintaining temperature when the semiconductor layer structure of FIG. 8 is heat-treated to a temperature of 200° C. In the figure, the ordinate represents the carrier concentration (unit: $cm^{-3}$) and the abscissa represents the time duration of maintaining the temperature (hr). As can be seen from FIG. 10, even in a heat treatment at a low temperature of 200° C., a carrier concentration decreases by maintaining the temperature for 100 hours or more. This indicates that the thermal deterioration of the semiconductor device occurs at such a temperature as selected above and, at the same time, there is a possibility that the semiconductor device will deteriorate over a long period of time even at a temperature lower than the above temperature, indicating that the reliability of the semiconductor device is extremely poor.

Figure 1:
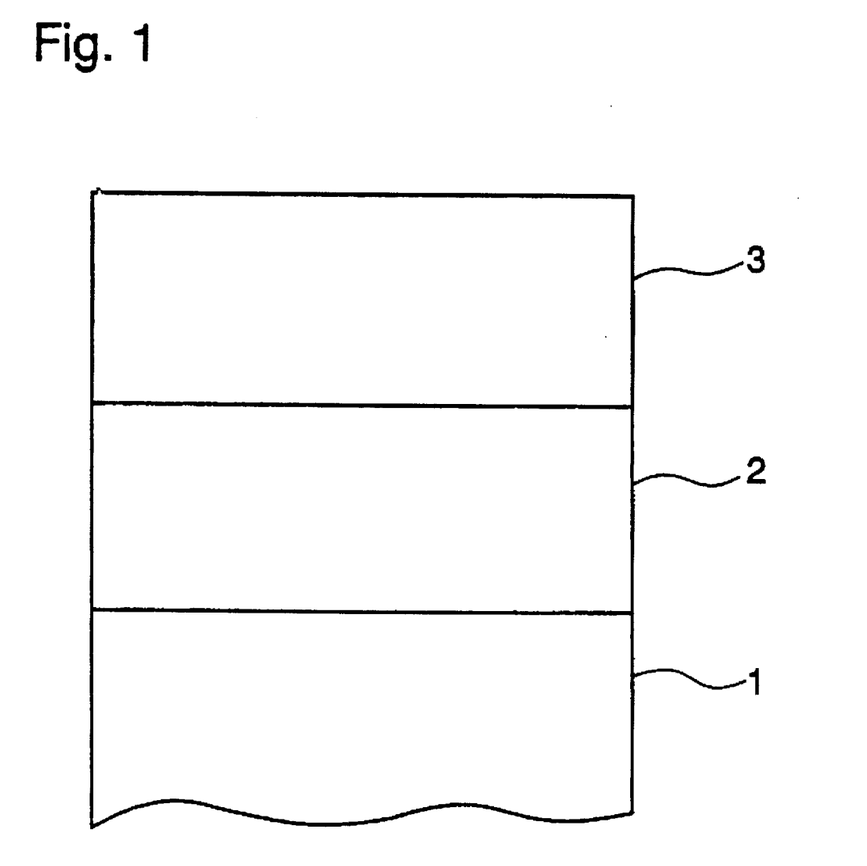
FIG. 1 is a cross-sectional view illustrating a semiconductor layer structure for describing a method of fabricating a semiconductor device according to a first embodiment of the present invention.

FIG. 1 is a cross-sectional view for describing the main process of a method of fabricating a semiconductor device according to a first embodiment of the present invention. The method of fabricating the semiconductor device according to the first embodiment includes a process a reheat treatment is performed to an impurity-doped AlInAs layer which is deteriorated by fluorine infiltration due to the initial heat treatment, so that the fluorine in the impurity-doped AlInAs layer is removed and the quality of the semiconductor device is recovered. In FIG. 1, reference numeral 1 designates an S.I.-InP substrate, reference numeral 2 designates an i-AlInAs layer about 2500 Å thick, and reference numeral 3 designates an Si-doped AlInAs layer about 2500 Å thick.

Figure 2:
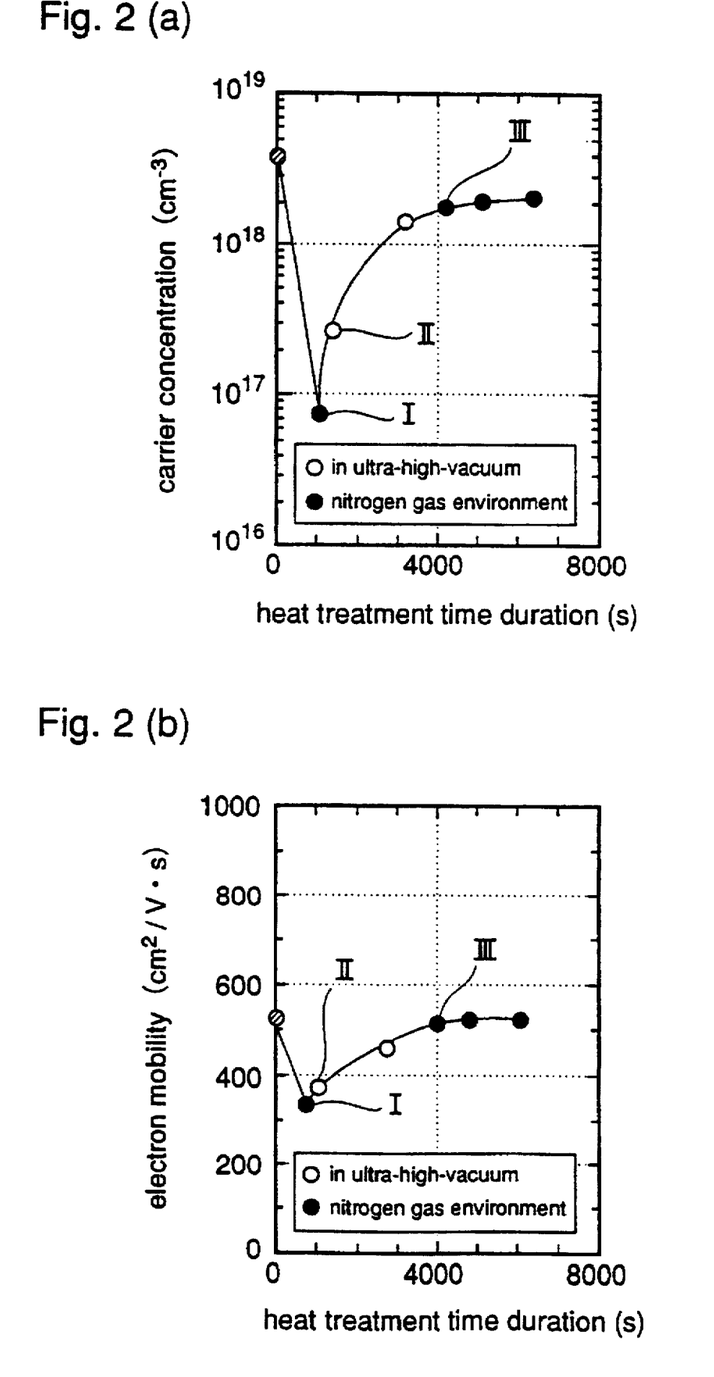
FIGS. 2(a)–2(b) are graphs for describing the method of fabricating the semiconductor device according to the first embodiment of the present invention.

FIGS. 2(a)–2(b) are graphs illustrating results of Hall measurements of the semiconductor layer structure illustrated in FIG. 1 which is formed through the method of fabricating the semiconductor device of the first embodiment. FIG. 2(a) indicates a relationship between a heat treatment duration (unit: second) for the semiconductor layer structure illustrated in FIG. 1 and a carrier concentration n (unit: $cm^{-3}$) and FIG. 2(b) indicates a relationship between the heat treatment duration (unit: second) and the electron mobility μ (unit: $cm^2/Vs$). In the figures, circles with slashed lines represent a state before the heat treatment, black circles represent a case where heat treatment is performed under an environment supplied with nitrogen gas, and white circles represent a case where heat treatment is performed in ultra-high vacuum.

The main process of the method of fabricating the semiconductor device according to the first embodiment will be described with reference to FIG. 1.

First, the i-AlInAs layer 2 and the Si-doped AlInAs layer 3 are successively formed on the S.I.-InP semiconductor substrate 1 inside an MBE chamber, thereby producing the semiconductor layer structure which serves as a sample as shown in FIG. 1. Then the semiconductor layer structure is taken out from the MBE chamber. The Hall measurement was performed on the sample then and the sheet carrier concentration of the Si-doped AlInAs layer 3 was n=4×10$^{18}$ $cm^{-3}$ and the electron mobility at 300° K. was μ (300° K.)=500 $cm^2/Vs$.

Next, electrical characteristics of the sample are deteriorated by heat-treating the sample for 18 minutes at 400° C. under a nitrogen environment. The Hall measurement was again performed then. The carrier concentration was n=8× 10$^{16}$ $cm^{-3}$ and the electron mobility was μ (300° K.)=320 $cm^2/Vs$. Both the carrier concentration and the electron mobility decrease and it can be seen that the electrical characteristics of the sample are in a deteriorated state due to heat.

Figure 11:
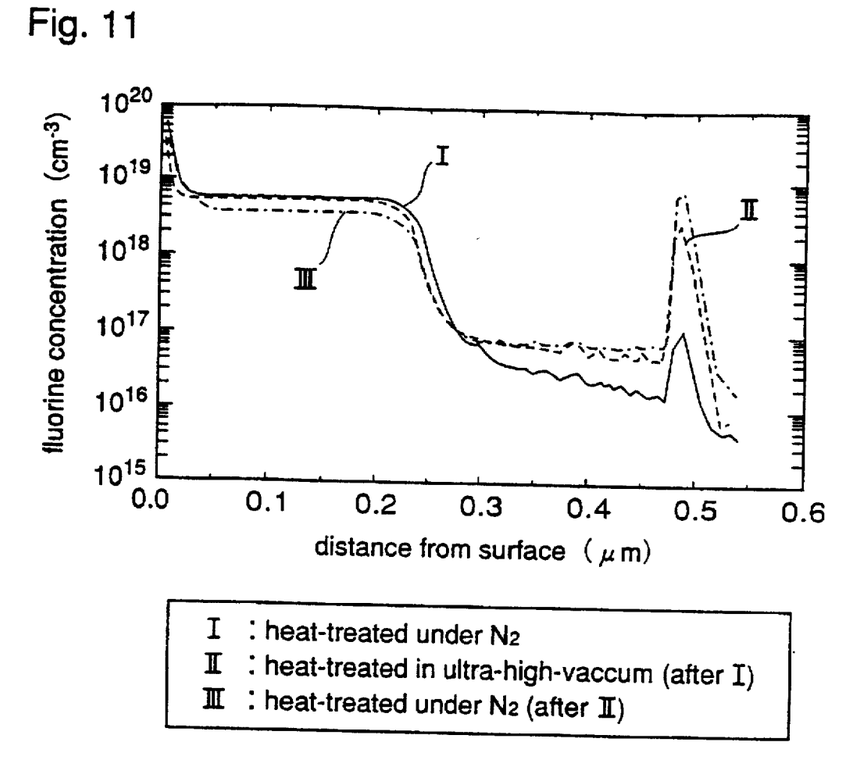
FIG. 11 is a graph illustrating a fluorine profile for describing a method of fabricating the semiconductor device according to the first embodiment of the present invention.

Next, the sample whose characteristics were deteriorated by the heat is placed in the MBE chamber and heat-treated for seven minutes at 400° C. in the ultra-high vacuum in order to extract the infiltrated fluorine from the sample. For both the carrier concentration n and the electron mobility μ, values were recovered from the deteriorated states caused by the heat treatment, and by performing similar treatment continuously, they recovered further (FIGS. 2(a)–2(b)). The fluorine profile was measured then by SIMS measurement and it was revealed that the fluorine concentration decreased when heat treatment was performed in the ultra-high vacuum in contrast to a state where characteristics were deteriorated by heat as shown in FIG. 11. In FIG. 11, the ordinate represents fluorine concentration (unit: $cm^{-3}$), abscissa represents a distance from the surface (unit: μm), the solid line represents the profile of step I in FIGS. 2(a)–2(b), a dashed line represents the profile of step II, and an alternate long and short dashed line represents the profile of step III. Therefore, it can be said that if the fluorine concentration decreases, the carrier concentration n and the electron mobility μ recover.

Figure 12:
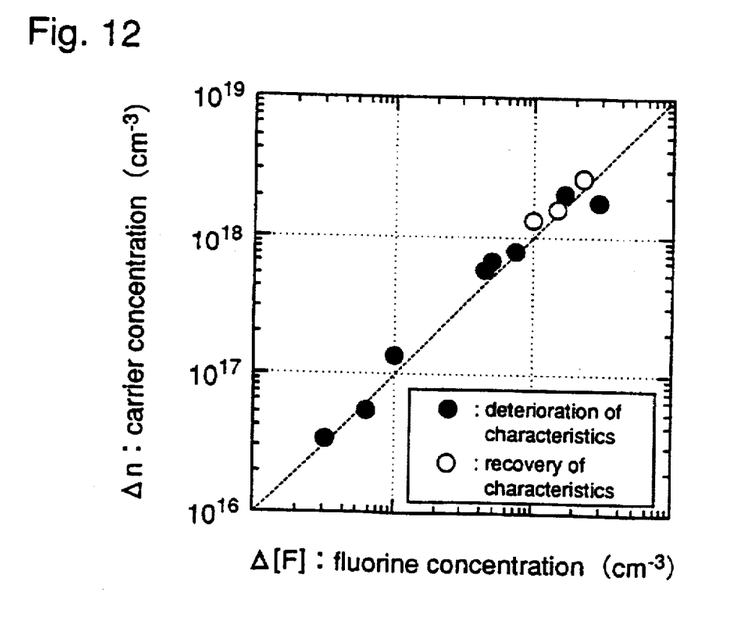
FIG. 12 is a graph illustrating a relationship between a change in fluorine concentration and a change in carrier concentration for describing a method of fabricating the semiconductor device according to the first embodiment of the present invention.

Furthermore, the increase in the fluorine concentration and the decrease in the carrier concentration during the deterioration of electrical characteristics of the Si-doped AlInAs layer 3 due to heat, and the decrease in the fluorine concentration and the increase in the carrier concentration during recovery of the characteristics by heat treatment in the ultra-high vacuum are presented in a graph with logarithmic scales in FIG. 12, the abscissa representing the absolute value of the change in the fluorine concentration and the ordinate representing the absolute value of the change in the carrier concentration. In FIG. 12, black circles represent values during deterioration of characteristics due to heat and white circles represent values during recovery from the deterioration of the characteristics. As can be seen, it is understood that the change in the fluorine concentration and the change in the carrier concentration have a certain relationship.

The above results illustrate that by again heat-treating in the ultra-high vacuum after the characteristics deterioration due to heat, the fluorine can be extract from the Si-doped AlInAs layer 3 and the Si-doped AlInAs layer 3 recover from the electrical characteristics deterioration due to heat treatment. Therefore a method of fabricating a semiconductor device including a process of infiltration fluorine into the Si-doped AlInAs layer 3 by heat treatment, by adding a process of removing the fluorine in the Si-doped AlInAs layer 3 by further heat treatment from the ultra-high vacuum after the initial heat treatment, a semiconductor device having desired electrical characteristics can be obtained.

Furthermore, after the heat treatment in the ultra-high vacuum, the environment was replaced with the one supplied with nitrogen gas, and it was again tried to deteriorate the semiconductor layer structure by heat. However, the carrier concentration n did not decrease as shown in FIGS. 2(a)–2(b), and the fluorine profile did not increase as shown in FIG. 11 and the deterioration due to reheating did not occur, revealing that the sample had durability against another heat treatment in nitrogen once the sample entered the recovery cycle, i.e., the sample was stable against heat treatment. Therefore, by heat-treating in the ultra-high vacuum a Si-doped AlInAs layer 3 which was once deteriorated by heat, the Si-doped AlInAs layer 3 is hard to deteriorate again and a highly-reliable semiconductor device is obtained.

Furthermore, using a tendency that the Si-doped AlInAs layer 3 in the recovery cycle is difficult to deteriorate again as described above, after the Si-doped layer 3 contacts the atmosphere, heat treatment is performed so that fluorine actively infiltrates the Si-doped layer 3 and characteristics are deteriorated. Then, by reheat treatment until the fluorine profile is stabilized, it is possible to obtain a highly-reliable semiconductor device which is difficult to deteriorate and is sufficiently durable in a high temperature reliability test.

Since the method of fabricating the semiconductor device according to this embodiment includes a process of infiltrating fluorine into the Si-doped AlInAs layer 3 by heat treatment in a nitrogen environment after the Si-doped AlInAs layer 23 contacts the atmosphere and a process of removing the fluorine form the Si-doped AlInAs layer 3 by further heat treatment in the ultra-high vacuum after the initial heat treatment, a highly-reliable semiconductor device which is difficult to deteriorate again and has desired electrical characteristics can be obtained.

While, in this first embodiment, dopant impurity in the AlInAs layer 3 is Si is described, this invention can be applied to the case where other impurities such as Sn (tin) and a similar effect as in the first embodiment can be obtained in this case.

While, in this first embodiment, the heat treatment in which the fluorine infiltrates into the Si-doped AlInAs layer 3 is performed in a nitrogen environment, this invention can be applied to a case where this heat treatment is performed in environments supplied with other carrier gases such as hydrogen and a similar effect as in the first embodiment can be obtained.

[Embodiment 2]

Figure 3:
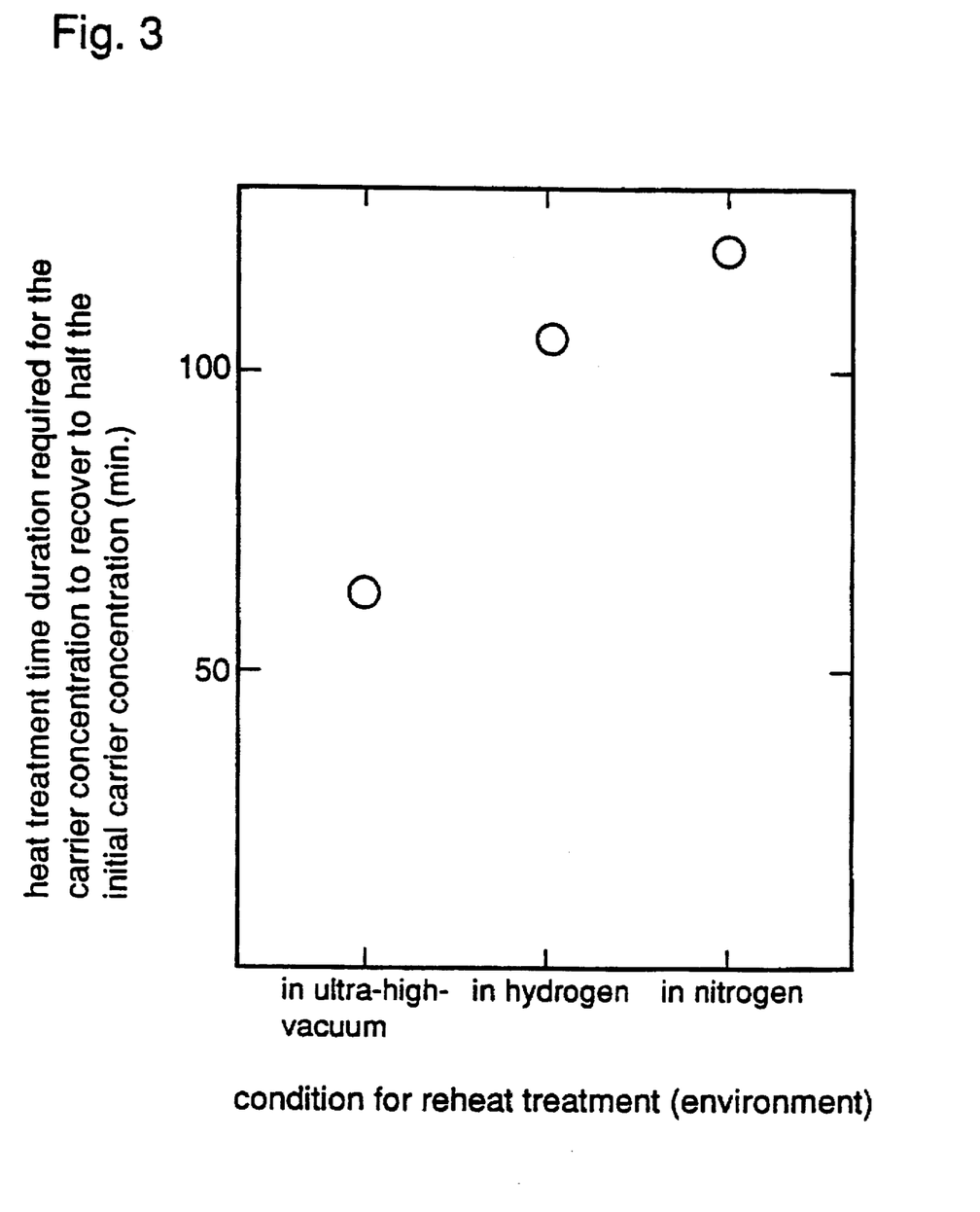
FIG. 3 is a graph for describing a method of fabricating a semiconductor device according to a second embodiment of the present invention.

FIG. 3 is for describing a method of fabricating a semiconductor device according to a second embodiment of the present invention. While, in the first embodiment, the case where the reheat treatment for removing the fluorine which infiltrated into the impurity-doped AlInAs layer due to the initial heat treatment is performed in an the ultra-high vacuum, this reheat treatment in the second embodiment is performed in an environment supplied with hydrogen or nitrogen. FIG. 3 shows the time duration of the reheat treatment (unit: minute) required for the carrier concentration of the Si-doped AlInAs layer 3 of the semiconductor layer structure shown in FIG. 1 which was deteriorated by heat to recover to half the carrier concentration before the deterioration by heat for the cases where the reheat treatment environments are supplied with hydrogen or nitrogen, or the ultra-high vacuum environment. The treatment temperature of the reheat treatment is 400° C.

As shown in FIG. 3, even in the reheat treatment in the environment supplied with hydrogen or nitrogen, the carrier concentration recovers. Therefore, it can be seen that even when the reheat treatment in the environments such as these is performed, the semiconductor layer structure can recover from the deteriorated state caused by heat and a semiconductor device which has less deterioration of electrical characteristics due to heat is obtained. The figure also shows that the reheat treatment in the ultra-high vacuum takes the least time for the recovery from the deterioration and the reheat treatment in the nitrogen environment takes the most time for the recovery.

In the method of fabricating the semiconductor device according to this embodiment, since a process of removing the fluorine in the Si-doped AlInAs layer 3 by heat treatment is performed in an environment supplied with either hydrogen or nitrogen, a similar effect as in the first embodiment is obtained.

Furthermore, according to the method of fabricating the semiconductor device of the second embodiment, since there is no need to use the ultra-high vacuum state, it is possible to perform a heat treatment process of removing the fluorine by using, for example, a nitrogen vessel of simple construction equipped with a means for heating and a means for continuously supplying nitrogen, and a semiconductor device having desired characteristics can be obtained at low cost.

While, in the second embodiment, the heat treatment is performed in an the environment supplied with either hydrogen or nitrogen, the heat treatment can also be performed in an environment supplied with a mixture of hydrogen or nitrogen in this invention, and a similar effect as in the second embodiment can be obtained in this case.

[Embodiment 3]

Figure 4:
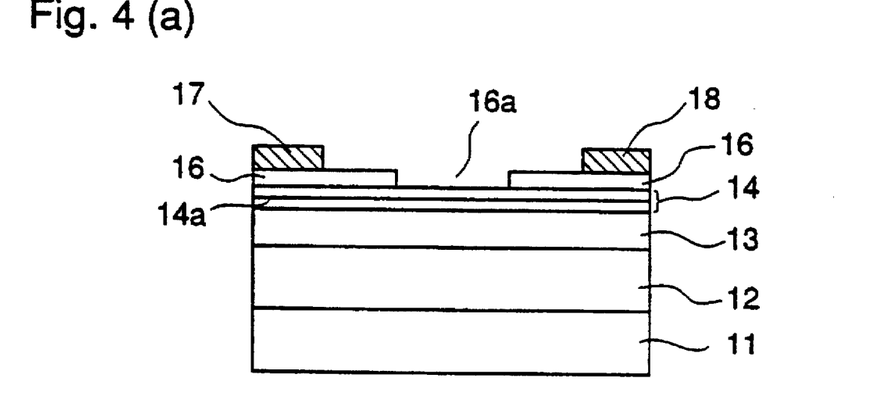
FIGS. 4(a)–4(c) are cross-sectional process views illustrating a method of fabricating an HEMT according to a third embodiment of the present invention.

FIGS. 4(a)–4(c) are cross-sectional views illustrating a method of fabricating an HEMT according to a third embodiment of the present invention using the method of fabricating the semiconductor device described in the first embodiment. In the figures, reference numeral 11 designates an S.I.-InP substrate, reference numeral 12 designates an AlInAs buffer layer about 2500 Å thick, reference numeral 13 designates an undoped InGaAs channel layer about 500 Å thick, and reference numeral 14 designates an AlInAs carrier supply layer about 340 Å thick in which an impurity such as Si is planar-doped (14a) at a spacing of 20 Å from the InGaAs channel layer 13. Reference numeral 16 designates an n type InGaAs ohmic layer about 500 Å thick, reference numeral 16a designates an opening in the n type InGaAs ohmic layer 16, reference numeral 17 designates a source electrode, reference numeral 18 designates a drain electrode, reference numeral 19 designates an EB (electron beam) resist used to form a recess groove, and reference numeral 20 is a photoresist used to form a gate electrode 24.

A method of fabrication will be described. First, the AlInAs layer 12 and the InGaAs channel layer 13 are successively formed on the InP substrate 11 inside an MBE (molecular beam epitaxy) chamber. Then the AlInAs layer about 20 Å thick is formed, and after the Si planar doping 14a is performed, the AlInAs layer about 320 Å thick is formed, thereby forming the AlInAs carrier supply layer 14. Then the n type InGaAs ohmic layer 16 is formed and the semiconductor layer structure is obtained.

Then the semiconductor layer structure is taken out from the MBE chamber and the source electrode 17 and the drain electrode 18 are formed by evaporation and lift-off. Next, an EB resist (not shown in the figures) is formed on the surface of the semiconductor layer structure and patterning is performed with an EB (electron beam) exposure. Then, using this EB resist as a mask, a portion of the n type InGaAs ohmic layer 16 between the source electrode 17 and the drain electrode 18 is removed by selective etching using an etchant comprising water, hydrogen peroxide ($H_2O_2$), and an organic acid, thereby forming the opening 16a. The EB resist is then removed (FIG. 4(a)). At this point, the AlInAs carrier supply layer 14 is exposed through the opening and fluorine sticks to the surface of the AlInAs carrier supply layer 14.

Then, as described in the first embodiment, by performing heat treatment in an the environment including a carrier gas such as nitrogen or hydrogen, the fluorine stuck to the surface of the AlInAs carrier supply layer 14 infiltrates into the AlInAs carrier supply layer 14, and then heat treatment in the ultra-high vacuum is performed to remove the fluorine.

Then the EB resist 19 and the photoresist 20 are formed on the surface of the semiconductor layer structure, and stepper light exposure is performed on the photoresist 20 so that a portion of the photoresist 20 between the source electrode 17 and the drain electrode 18 is removed to form an opening. Then EB exposure is performed on a portion of the EB resist 19 over the opening 16a within the opening of the photoresist 20, thereby forming an opening in the EB resist 19. Then using the EB resist 19 as a mask, etching is performed on the AlInAs carrier supply layer 14 using an etchant comprising water, hydrogen peroxide, and phosphoric acid ($H_3PO_4$) to form a recess (FIG. 4(b)).

Then a gate metal is formed on the surface of the semiconductor layer structure by evaporation. The EB resist 19 and the photoresist 20 are then removed and the gate electrode 24 is formed by lifting off the unnecessary gate metal, thereby obtaining the HEMT illustrated in figure 4(c).

The HEMT according to the third embodiment is a transistor which makes high speed operation possible because of the two-dimensional electron gas of high electron mobility generated at the interface of the InGaAs channel layer 13 and the AlInAs carrier supply layer 14 by joining the AlInAs carrier supply layer 14 onto the InGaAs channel layer 13. Since the prior art method of fabrication does not include the heat treatment process described in the first embodiment after the process illustrated in FIG. 4(a), the fluorine stuck to the surface of the AlInAs carrier supply layer 14 infiltrates the carrier supply layer. Consequently, the carrier supply layer 14 becomes deteriorated during the operation of the HEMT. The sheet carrier concentration of the two-dimensional electron gas also decreases and a HEMT having desired characteristics cannot be obtained. Because of these difficulties, it is extremely difficult to obtain a HEMT of high reliability. For example, MTTF (mean time to failure) of prior art HEMTs such as the one described above at 170° C. is on the order of $10^3$ hours and only few reached a practical level.

However, according to the method of fabrication of the third embodiment, the opening 16a for forming the recess is formed in the n type InGaAs ohmic layer 16, and the AlInAs carrier supply layer 14 is put in contact with the atmosphere. And then by performing the heat treatment as described in the first embodiment, the fluorine infiltrates into the AlInAs carrier supply layer 14. By further adding a process of removing the fluorine in ultra-high vacuum, the AlInAs carrier supply layer 14 can be made difficult to deteriorate, and a highly reliable. HEMT can be obtained.

For example, by using a method of fabrication such as the one described above, HEMT having MTTF of more than $10^6$ hours at 170° C., which is an improvement by three digits from a prior art HEMT, can be obtained.

In this third embodiment, the method of fabrication includes a process of fluorine infiltrating into the AlInAs carrier supply layer planar-doped with Si and a process of removing the fluorine by heat treatment in the ultra-high vacuum. Therefore, a highly reliable HEMT can be provided.

While, in this third embodiment, the heat treatment for removing the fluorine is performed in the ultra-high vacuum, the heat treatment can be performed under the nitrogen gas environment or hydrogen gas environment in this invention as described in the second embodiment, and a similar effect can be obtained as in the third embodiment.

In this third embodiment, the opening is formed in the n type InGaAs ohmic layer 16 to form the recess and the AlInAs carrier supply layer 14 contacts the atmosphere. Then the heat treatment for infiltrating and removing the fluorine is performed. However, in this invention, if it is after the AlInAs carrier supply layer 14 is formed, a process of making the AlInAs carrier supply layer 14 contact the atmosphere and then performing the heat treatment can be performed at any step, and a similar effect as in the third embodiment can be obtained.

While, in the first, second, and third embodiments, cases where MBE is used as a method of fabricating the semiconductor layer structure are described, other growth methods such as gas source MBE, CBE (chemical beam epitaxy), MOCVD (metalorganic chemical vapor deposition) can be used as a method of forming the semiconductor layer structure, and similar effects as in the above embodiments can be obtained.

While, in the first, second, and third embodiments, a semiconductor device having the AlInAs layer doped with an impurity is described, this invention can be applied to a case where a semiconductor device having an AlGaInAs layer doped with an impurity is used, and similar effects as in the above embodiments can be obtained.

What is claimed is:

1. A method of fabricating a semiconductor device comprising:

forming a layer comprising Al, In, and As and doped with an impurity;

infiltrating fluorine into said layer comprising Al, In, and As and doped with an impurity in a first heat treatment of said layer; and removing the fluorine from said layer comprising Al, In, and As and doped with an impurity in a second heat treatment after the first heat treatment.

2. The method of claim 1 including performing the second heat treatment for removing the fluorine from said layer comprising Al, In, and As and doped with an impurity in vacuum.

3. The method of claim 1 wherein the second heat treatment for removing the fluorine from said layer comprising Al, In, and As and doped with an impurity is performed in an ambient selected from the group consisting of nitrogen, hydrogen, and a mixture of nitrogen and hydrogen.

4. The method of claim 1 wherein:

said semiconductor device is a high electron mobility transistor, and said layer comprising Al, In, and As and doped with an impurity is a carrier supply layer of the high electron mobility transistor.

5. The method of claim 1 wherein the layer comprising Al, In, and As and doped with an impurity is an AlInAs layer doped with an impurity.

6. A method of fabricating a semiconductor device comprising:

preparing a semi-insulating substrate;

forming an undoped channel layer on the semiconductor substrate;

forming a carrier supply layer comprising Al, In, and As and doped with an impurity on the channel layer;

forming an ohmic contact layer on the carrier supply layer;

forming a source electrode and a drain electrode on the ohmic contact layer;

forming an opening by etching a portion of the ohmic contact layer between the source electrode and the drain electrode so that part of the carrier supply layer is exposed;

infiltrating fluorine into the carrier supply layer in a first heat treatment of said carrier supply layer;

removing the fluorine from the carrier supply layer in a second heat treatment after the first heat treatment; and forming a recess in a portion of the carrier supply layer exposed in the opening and, then, forming a gate electrode in the recess.

7. A method of fabricating a semiconductor device comprising:

preparing a semi-insulating InP substrate;

successively forming on the semi-insulating InP substrate an AlInAs buffer layer, an undoped InGaAs channel layer, and an AlInAs carrier supply layer planar-doped with an impurity;

forming an n type InGaAs ohmic contact layer on the AlInAs carrier supply layer;

forming a source electrode and a drain electrode on the n type InGaAs ohmic contact layer;

forming an opening by etching a portion of the n type InGaAs ohmic contact layer between the source electrode and the drain electrode so that part of the AlInAs carrier supply layer is exposed;

infiltrating fluorine into the AlInAs carrier supply layer in a first heat treatment of the AlInAs carrier supply layer;

removing the fluorine from the AlInAs carrier supply layer in a second heat treatment after the first heat treatment; and forming a recess in a portion of the AlInAs carrier supply layer exposed in the opening and, then, forming a gate electrode in the recess.

8. A semiconductor device having a layer comprising Al, In, and As and doped with an impurity wherein said layer comprising Al, In, and As and doped with an impurity is heat-treated so that fluorine is infiltrated into this layer and, then, reheat-treated so that the fluorine is removed from this layer.

* * * * *